United States Patent [19]
Kim

[11] Patent Number: 6,020,795
[45] Date of Patent: Feb. 1, 2000

[54] ELECTRICALLY CONTROLLABLE IMPEDANCE MATCHING DEVICE FOR USE IN RF AMPLIFIER

[75] Inventor: Sung-Uk Kim, Suwon-shi, Rep. of Korea

[73] Assignee: Samsung Electronics Co., Ltd, Rep. of Korea

[21] Appl. No.: 09/081,326

[22] Filed: May 19, 1998

[30] Foreign Application Priority Data

May 19, 1997 [KR] Rep. of Korea ....................... 97/19224

[51] Int. Cl.[7] ....................................... H01P 5/00
[52] U.S. Cl. ............................. 333/33; 333/109; 333/164
[58] Field of Search .................................. 333/109, 115, 333/116, 139, 156, 160, 161, 164, 32, 33, 263

[56] References Cited

U.S. PATENT DOCUMENTS

| | | | |
|---|---|---|---|
| 3,423,699 | 1/1969 | Hines | 333/156 X |
| 3,500,259 | 3/1970 | Seidel | 333/109 X |
| 3,768,045 | 10/1973 | Chung | 333/164 |
| 4,493,112 | 1/1985 | Bruene | 455/123 |
| 4,638,269 | 1/1987 | Dawson et al. | 333/156 X |
| 4,859,972 | 8/1989 | Franke et al. | 333/161 X |

*Primary Examiner*—Paul Gensler
*Attorney, Agent, or Firm*—Dilworth & Barrese

[57] ABSTRACT

An electrically controllable impedance matching device for matching an impedance of a signal output from a signal generator in an RF (Radio Frequency) amplifier. The impedance matching device includes a 3-dB directional coupler having a coupling terminal, a through terminal, an isolation terminal being an output terminal, and an input terminal connected to the signal generator; a first phase shifter connected to the coupling terminal, for shifting a phase of the signal according to a control signal; a second phase shifter connected to the through terminal, for shifting the phase of the signal according to the control signal; and controller for generating the control signal. Each of the phase shifters includes a 3-dB directional coupler having a coupling terminal, a through terminal, an isolation terminal being an output terminal, and an input terminal; a first varactor diode connected between the coupling terminal and a ground terminal, of which capacitance is variable according to the control signal; and a second varactor diode connected between the through terminal and a ground terminal, of which capacitance is variable according to the control signal.

9 Claims, 3 Drawing Sheets

ELECTRICALLY CONTROLLABLE IMPEDANCE MATCHING DEVICE FOR USE IN RF AMPLIFIER

BACKGROUND OF THE INVENTION

1. Field of the Invention

The present invention relates to an impedance matching device for use in an RF (radio frequency) amplifier such as a microwave amplifier, and in particular, to an electrically controllable impedance matching device (or tuner).

2. Description of the Related Art

In general, a microwave amplifier employs a mechanically controllable tuner or an electrically controllable tuner. FIG. 1 shows a known mechanically controllable tuner.

Referring to FIG. 1, the mechanically controllable tuner includes a body 10 being a transmission line, and a stub 20 coupled to the body 10. The mechanically controllable tuner is divided into a single stub tuner, a double stub tuner, and a triple stub tuner, according to the number of the stubs 20 coupled to the body 10. As is well known in the art a matching condition of the stub 20 depends on an interval between two lead wires of the stub 20, the position of the short-circuit wire, and a position where the transmission line is coupled to the stub. A length L2 of the stub 20 is adjustable by shorting (or short-circuiting) the lead wires using a mechanically controllable sliding rod 22, as shown by reference numeral 21. For an accurate control of the impedance, it is preferable to increase the number of the stubs 20 coupled to the body 10.

To adjust an impedance matching point of the tuner, the user should vary the length of the stub 20 manually, which will take much time. Besides, in this case, it is very difficult to set an accurate matching point. In addition, when the lead wires of the stub 20 are shorted by the sliding rod 22, the stub 20 may be damaged. Moreover, the stub 20 should increase in length, as the operating frequency band becomes lower.

FIG. 2 shows a schematic block diagram of a known electrically controllable tuner. Referring to FIG. 2, reference numeral 100 denotes an input terminal connected to a signal generator, reference numeral 110 denotes an input matching circuit 110 for controlling phase and amplitude of the signal input from the signal generator, reference numeral 120 denotes an amplifier for amplifying an output signal of the input matching circuit 110, and reference numeral 130 denotes an output matching circuit for controlling phase and amplitude of an output signal of the amplifier 120. Here, the amplifier 120 is composed of, by way of example, a transistor Q1 having a base connected to the output of the input matching circuit 110, an emitter connected to the ground, and a collector connected to an input of the output matching circuit 130. Alternatively, the amplifier 120 may be realized by an FET (Field Effect Transistor).

The known electrically controllable tuner controls the phase and amplitude of the signal by using the input and output matching circuits 110 and 130, to control input and output impedances seen respectively at input and output terminals 1 and 2 of the amplifier 120.

FIG. 3 shows a detailed circuit diagram of the input matching circuit 110. For reference, the output matching circuit 130 also has the same construction. Referring to FIG. 3, reference numeral 100 denotes the input terminal connected to the signal generator, and reference numeral 111 denotes a circulator. A termination 116 absorbs (or terminates) a reflected wave output from the circulator 111, if any. A variable attenuator 112 attenuates amplitude of the input signal received through the circulator 111 according to a DC attenuation control signal. A variable phase shifter 113 shifts the phase of the output signal of the variable attenuator 112 according to the DC phase control signal. The DC control signal is generated from a controller (not shown) which may be a microprocessor having a ROM (Read Only Memory) for storing a control program and a RAM (Random Access Memory) for temporarily storing data generated in the process of executing the control program. A directional coupler 114 splits an incident wave output of the variable phase shifter 113 from the reflected wave output of the amplifier 120. A power detector 115 measures an incident power and a reflection power of the incident wave and the reflected wave received from the directional coupler 114.

As can be appreciated from the foregoing, the known electrically controllable tuner is superior to the mechanically controllable tuner in that it can adjust the impedance matching point more accurately. However, it requires the expensive elements such as the circulator 111, the variable attenuator 112, the variable phase shifter 113, and the directional coupler 114. Further, the increase in number of the elements leads to an increase in size of the tuner undesirably. In addition, generally known electrically controllable phase shifters cannot shift the phase over 90°.

SUMMARY OF THE INVENTION

It is therefore an object of the present invention to provide an electrically controllable compact tuner.

To achieve the above object, there is provided an electrically controllable impedance matching device for matching an impedance of a signal output from a signal generator in an RF Radio Frequency) amplifier. The impedance matching device includes a 3-dB directional coupler having a coupling terminal, a through terminal, an isolation terminal being an output terminal, and an input terminal connectable to the signal generator; a first phase shifter connected to the coupling terminal, for shifting a phase of the signal according to a control signal; a second phase shifter connected to the through terminal, for shifting the phase of the signal according to the control signal; and a controller for generating the control signal.

Preferably, each of the phase shifters includes a 3-dB directional coupler having a coupling terminal, a through terminal, an isolation terminal being an output terminal, and an input terminal; a first varactor diode connected between the coupling terminal and a ground terminal, of which capacitance is variable according to the control signal; and a second varactor diode connected between the through terminal and a ground terminal, of which capacitance is variable according to the control signal.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF PREFERRED EMBODIMENTS

Figure 1:
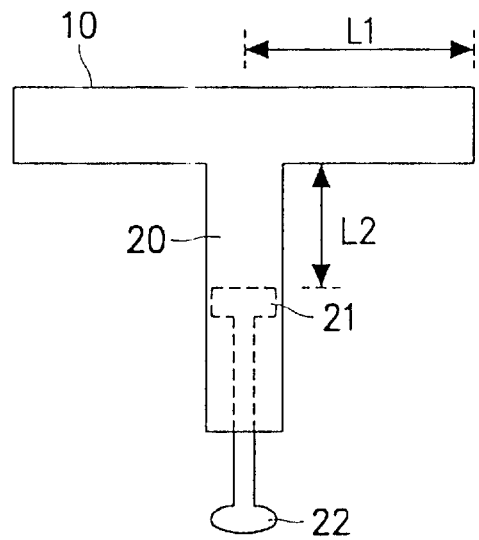
FIG. 1 is a diagram illustrating a known mechanically controllable tuner.

A preferred embodiment of the present invention will be described in detail hereinbelow with reference to the accompanying drawings, in which like reference numerals denote the same elements. In the following description, numerous specific details are set forth to provide a more thorough understanding of the present invention. It will be apparent, however, to one skilled in the art that the present invention may be practiced without these specific details. In other instances, well known functions or constructions have not been described so as not to obscure the present invention.

Figure 2:
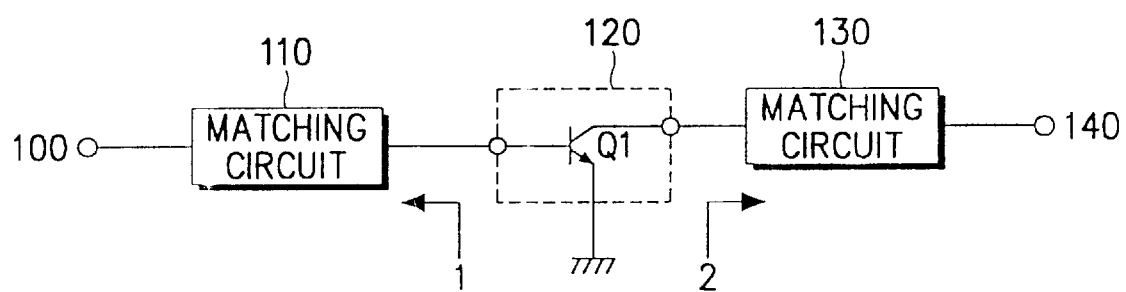
FIG. 2 is a schematic block diagram of a known electrically controllable tuner.
Figure 3:
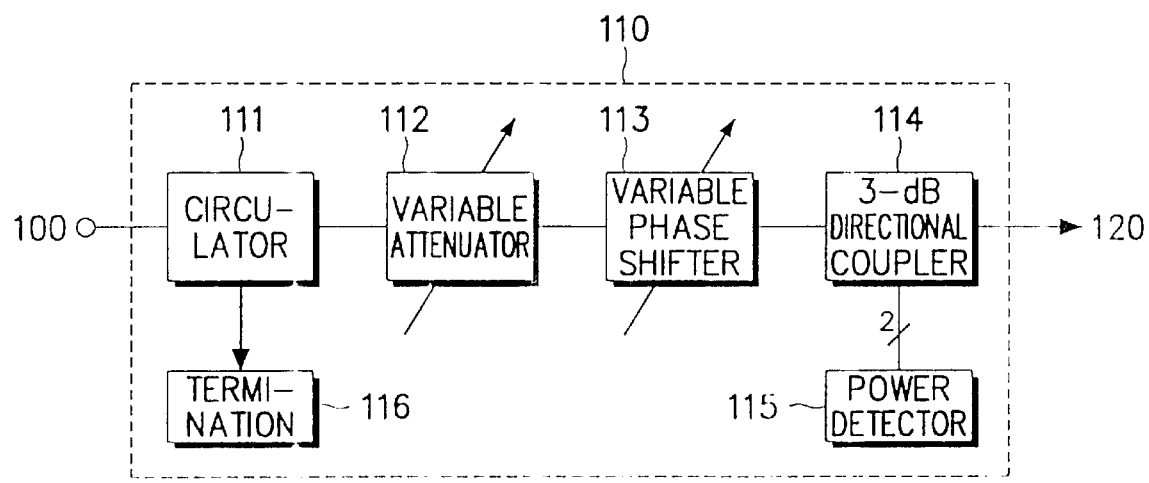
FIG. 3 is a detailed circuit diagram of an input matching circuit (110) of FIG. 2.
Figure 4:
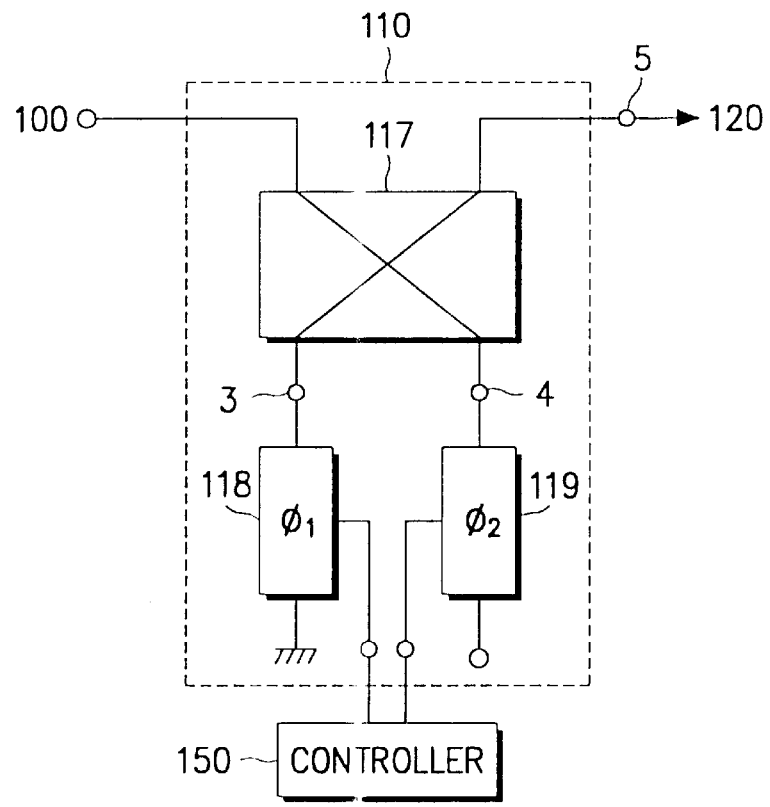
FIG. 4 is a diagram of a matching circuit according to a preferred embodiment of the present invention.

FIG. 4 illustrates a matching circuit 110 according to the present invention, which is applicable to the electrically controllable tuner of FIG. 2. Referring to FIG. 4, the matching circuit 110 includes a 3-dB directional coupler 117 connected to the input terminal 100, which is a 3-dB distributed hybrid circuit. Further, the matching circuit 110 includes a one-terminal phase shifter 118 and a two-terminal phase shifter 119. The one-terminal phase shifter 118 connected to a coupling terminal 3 of the 3-dB directional coupler 117 has an output terminal shorted (or grounded). The two-terminal phase shifter 119 connected to a through terminal 4 of the 3-dB directional coupler 117 has an output terminal opened. A controller 150 generates a DC (Direct Current) control signal for electrically controlling the phase shifters 118 and 119. In particular, the controller 150 is realized by a microprocessor having a ROM for storing a control program according to the invention, a RAM for temporarily storing data generated in the process of executing the control program and a digital to analog (D/A) converter for generating the DC control signal in response to data received from the microprocessor.

Figure 5:
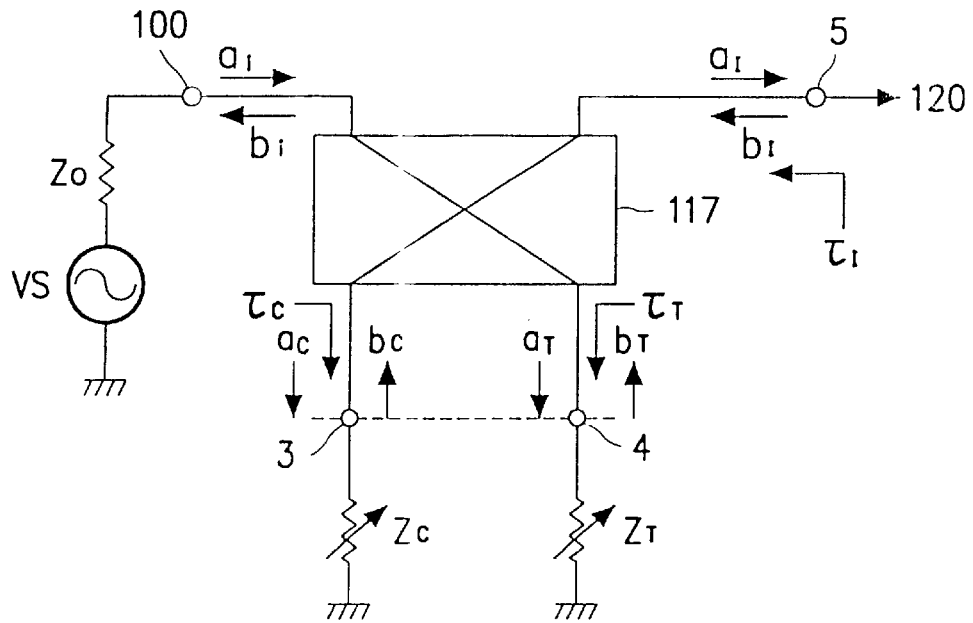
FIG. 5 is a diagram for explaining operation of a 3-dB directional coupler (117) of FIG. 4.

FIG. 5 shows an equivalent diagram of the matching circuit 110, for explaining operation of the 3-dB directional coupler 117. Referring to FIG. 5, reference letter $a_i$ denotes an incident wave at the input terminal 100, reference letter $a_c$ an incident wave at the coupling terminal 3, reference letter $a_T$ an incident wave at the through terminal 4, and reference letter $a_I$ an incident wave at an isolation terminal 5 being an output terminal. Further, reference letter $b_i$ denotes a reflected wave at the input terminal 100, reference letter $b_c$ a reflected wave at the coupling terminal 3, reference letter $b_T$ a reflected wave at the through terminal 4, and reference letter $b_I$ a reflected wave at the isolation terminal 5. As is well known, when the isolation characteristic of the 3-dB directional coupler 117 is below −30 dB, the reflected wave at the input terminal 100 is zero.

When the incident wave $a_1$ is input to the input terminal 100, the output characteristics of the incident wave at the respective terminals may be determined by the following Equations (1)–(3).

$$a_C = \frac{a_i}{\sqrt{2}} \tag{1}$$

$$a_T = \frac{a_i}{\sqrt{2}} e^{-j90°} \tag{2}$$

-continued
$$a_I = 0 \tag{3}$$

Further, when a coupling terminal impedance $Z_c$ and a through terminal impedance $Z_T$ are changed, the reflection coefficients at the respective terminals can be expressed by the following Equations (4) and (5).

$$\tau_c = \frac{Z_c - Z_0}{Z_c + Z_0} \tag{4}$$

$$\tau_T = \frac{Z_T - Z_0}{Z_T + Z_0} \tag{5}$$

It can be appreciated from Equations (4) and (5) that the reflection coefficients of the coupling terminal 3 and the through terminal 4 depend on their terminal impedances.

Therefore, the reflected waves at the respective terminals can be written as shown in the following Equations (6)–(8).

$$b_c = \frac{a_i}{\sqrt{2}} \cdot \tau_c \tag{6}$$

$$b_T = \frac{a_i}{\sqrt{2}} e^{-j90°} \cdot \tau_T \tag{7}$$

$$b_I = b_c \cdot e^{-j90°} + b_T = \frac{a_i}{\sqrt{2}} e^{-j90°} \cdot (\tau_c + \tau_T) \tag{8}$$

As can be appreciated from Equation (8), the incident wave $a_i$ input from the input terminal 100 is reflected at the coupling terminal 3 and the through terminal 4, and then output to the isolation terminal 5. As being vector signals, the reflected signals are vector-synthesized.

Thus, the reflection coefficient at the isolation terminal 5 can be determined by the following Equation (9).

$$\tau_I = \frac{b_I}{a_I} = \frac{a_I^{-1} \cdot a_i \cdot e^{-j90°}}{\sqrt{2}} (\tau_c + \tau_T) = A \cdot (\tau_c + \tau_T) \tag{9}$$

$$A = \frac{a_I^{-1} \cdot a_i \cdot e^{-j90°}}{\sqrt{2}} \tag{10}$$

As shown in Equations (9) and (10), the reflection coefficient of the isolation terminal 5 is a function of the reflection coefficients of the coupling terminal 3 and the through terminal 4. Therefore, it can be understood that the isolation terminal impedance can be adjusted by varying the coupling terminal impedance and the through terminal impedance. In this manner, impedance matching can be achieved.

Figure 6:
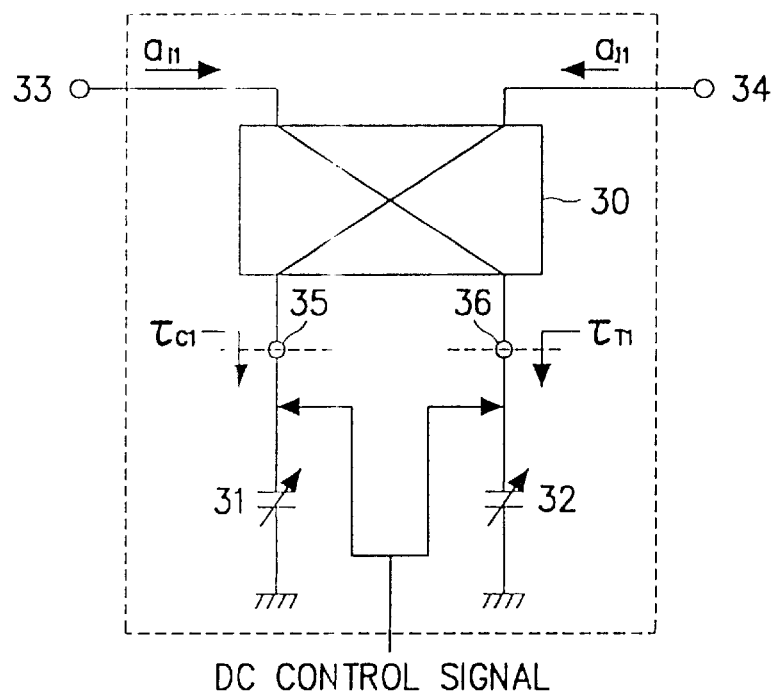
FIG. 6 is a detailed circuit diagram of phase shifter (118 or 119) of FIG. 4.

FIG. 6 shows a detailed circuit diagram of the phase shifter 118 (or 119) of FIG. 4. Referring to FIG. 6, reference numeral 30 denotes a 3-dB directional coupler, and reference numerals 31 and 32 denote varactor diodes for varying capacitances thereof in response to the DC control signal output from the controller 150. Further, reference numerals 33, 34, 35, and 36 denote an input terminal, an isolation terminal, a coupling terminal, and a through terminal, respectively.

Herein, if the two varactor diodes 31 and 32 have the same capacitance characteristics, the reflection coefficients of the coupling terminal 35 and the through terminal 36 are as shown in the following Equation (11).

$$\frac{\tau_{cI}}{\tau_{TI}} = e^{-j90°} = 1 \tag{11}$$

Therefore, the reflected wave of the isolation terminal 5 can be expressed by the following Equation (12).

$$a_{II} = \frac{a_{iI}}{\sqrt{2}} e^{-j90°} \cdot (\tau_{cI} + \tau_{TI}) = \sqrt{2}\, a_{iI} e^{-j90°} \tau_{cI} \tag{12}$$

As a result, an amount of phase shift is as shown in the following Equation (13).

$$\angle(a_{I1}/a_{iI}) = -90° + \angle \tau_{c1} \tag{13}$$

Accordingly, it can be understood from Equation (13) that the phase shift depends on the reflection coefficient at the coupling terminal 35.

In addition, if the isolation terminal 34 of the phase shifter is opened or shorted, the incident waves reflected at the coupling terminal 35 and the through terminal 36 are output to the isolation terminal 34, and undergoes a total reflection by the isolation terminal impedance. That is, the reflected wave is reflected again to the input terminal 33, resulting into the double phase shift. In this case, the phase shift can be expressed by the following Equation (14).

$$\angle(a_{I1}/a_{iI}) = -180° + 2\angle \tau_{c1} \tag{14}$$

That is, the phase shifter with the 3-dB directional coupler according to the invention can shift the phase of the two-terminal phase shifter by 180° by opening (119) or shorting (118) the isolation terminal 34 of the phase shifter, whereas the conventional phase shifter can only shift the phase by 90°. Accordingly, it is possible to realize the whole range of impedances in the Smith impedance chart As described above, the electrically controllable tuner of the invention is compact and inexpensive to fabricate.

While the invention has been shown and described with reference to a specific preferred embodiment thereof, it will be understood by those skilled in the art that various changes in form and details may be made therein without departing from the spirit and scope of the invention as defined by the appended claims.

What is claimed is:

1. An electrically controllable impedance matching device for matching an impedance of a signal output from a signal generator in an RF (Radio Frequency) amplifier, comprising:

a 3-dB hybrid element having a coupling terminal having an associated coupling terminal impedance, a through terminal having an associated through terminal impedance, an isolation terminal being an output terminal having an associated isolation terminal impedance, and an input terminal connected to said signal generator, the 3-dB hybrid element performing impedance matching of said signal output from the signal generator by directly varying the through terminal impedance and the coupling terminal impedance thereby indirectly adjusting the isolation terminal impedance to match said signal generator output impedance;

a first phase shifter connected to said coupling terminal, for shifting a phase of the signal according to a control signal to vary one of a coupling and through terminal impedance;

a second phase shifter connected to said through terminal, for shifting the phase of the signal according to said control signal to vary one of a coupling and through terminal impedance; and a controller for generating said control signal.

2. The electrically controllable impedance matching device as claimed in claim 1, wherein said 3-dB hybrid element comprises a 3-dB directional coupler.

3. The electrically controllable impedance matching device as claimed in claim 1, wherein said control signal is a DC (Direct Current) control signal.

4. The electrically controllable impedance matching device as claimed in claim 1, wherein said controller includes a microprocessor operatively coupled to a digital to analog convertor, said microprocessor and digital to analog convertor generating said control signal.

5. The electrically controllable impedance matching device as claimed in claim 1, wherein each of said phase shifters comprises:

a 3-dB directional coupler having a second coupling terminal, a second through terminal, a second isolation terminal, and a second input terminal;

a first varactor diode connected between the second coupling terminal and a circuit ground terminal, said first varactor diode having a capacitance that is variable according to said control signal; and a second varactor diode connected between the second through terminal and the circuit ground terminal, said second varactor diode having a capacitance that is variable according to said control signal.

6. The electrically controllable impedance matching device as claimed in claim 5, wherein said control signal is a DC (Direct Control) control signal.

7. The electrically controllable impedance matching device as claimed in claim 6, wherein said controller includes a microprocessor operatively coupled to a digital to analog covertor, said microprocessor and digital to analog convertor providing said control signal.

8. The electrically controllable impedance matching device as claimed in claim 5, wherein said first phase shifter has said second isolation terminal shorted to the circuit ground terminal, and said second phase shifter has said second isolation terminal open circuited.

9. The electrically controllable impedance matching device as claimed in claim 5, wherein each said phase shifter shifts the phase of the signal about an initial phase shift of 90° when said second isolation terminal is open and shifts the phase of the signal about an initial phase shift of 180° when said second isolation terminal is short circuited to the circuit ground terminal.

* * * * *